United States Patent [19]

Leeb

[11] Patent Number: 5,317,292

[45] Date of Patent: May 31, 1994

[54] DEVICE WITH FLEXIBLE, STRIPLINE CONDUCTORS AND A METHOD OF MANUFACTURING SUCH A DEVICE

[75] Inventor: Karl-Erik Leeb, Djurhamn, Sweden

[73] Assignee: Telefonaktibolaget L M Ericsson, Stockholm, Sweden

[21] Appl. No.: 897,813

[22] Filed: Jun. 12, 1992

[30] Foreign Application Priority Data

Jun. 14, 1991 [SE] Sweden .............................. 91018341

[51] Int. Cl.⁵ .............................................. H01P 3/08
[52] U.S. Cl. ...................................... 333/238; 29/830
[58] Field of Search ............... 333/238, 246, 236, 245, 333/247; 174/117 F, 117 FF, 117 AS, 117 A, 113 AS, 120 R, 120 SC; 156/644, 652, 656; 29/285, 286

[56] References Cited

U.S. PATENT DOCUMENTS

| | | | |
|---|---|---|---|
| 4,673,904 | 6/1987 | Landis | 333/238 |
| 4,772,864 | 9/1988 | Otto et al. | 333/238 |
| 4,816,616 | 3/1989 | Jones | 174/68.5 |
| 4,909,909 | 3/1990 | Florjancic et al. | 204/15 |
| 4,930,215 | 6/1990 | Roche et al. | 29/830 |
| 5,184,210 | 2/1993 | Westbrook | 333/238 |

FOREIGN PATENT DOCUMENTS 0288767 1/1988 European Pat. Off. .
0337331 10/1989 European Pat. Off. .

OTHER PUBLICATIONS

International-Type Search Report dated Dec. 16, 1991.

Primary Examiner—Raymond A. Nelli
Attorney, Agent, or Firm—Burns, Doane, Swecker & Mathis

[57] ABSTRACT

In a device having flexible, stripline conductors surrounded by a dielectric and ground planes, a conductor laminate (1) comprising a substrate (1) and conductors etched on one of its surfaces and windows cut between the conductors and a ground plane laminate comprising a substrate cut essentially similarly to the substrate of the conductor laminate with somewhat larger dimensions and a copper foil arranged on one of the sides of the substrate are adhesively bonded to each other with the conductors of the conductor laminate engaged with that side of the substrate of the ground plane laminate which is not covered by a foil. A metallization is provided on the side of the device which is opposite to the foil covered surface of the ground plane laminate. This metallization is electrically connected to said foil covered surface such that conductors and substrates are completely enclosed by an electrically conducting layer.

14 Claims, 4 Drawing Sheets

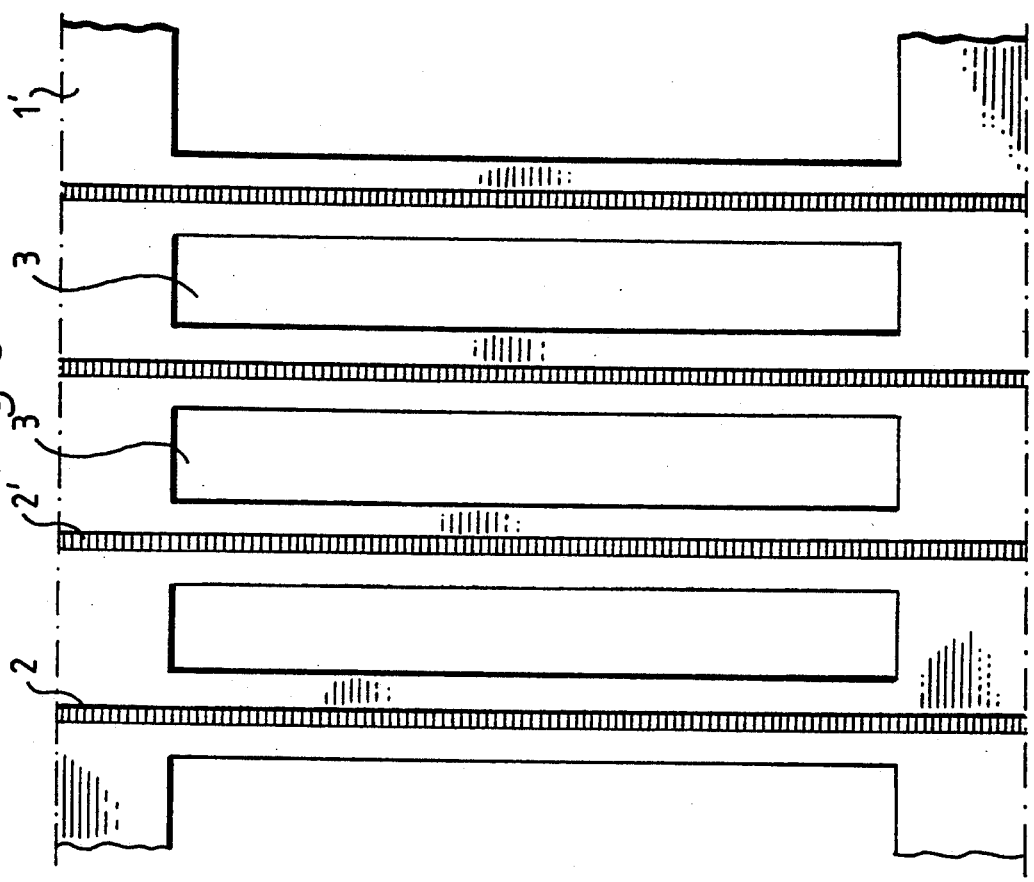
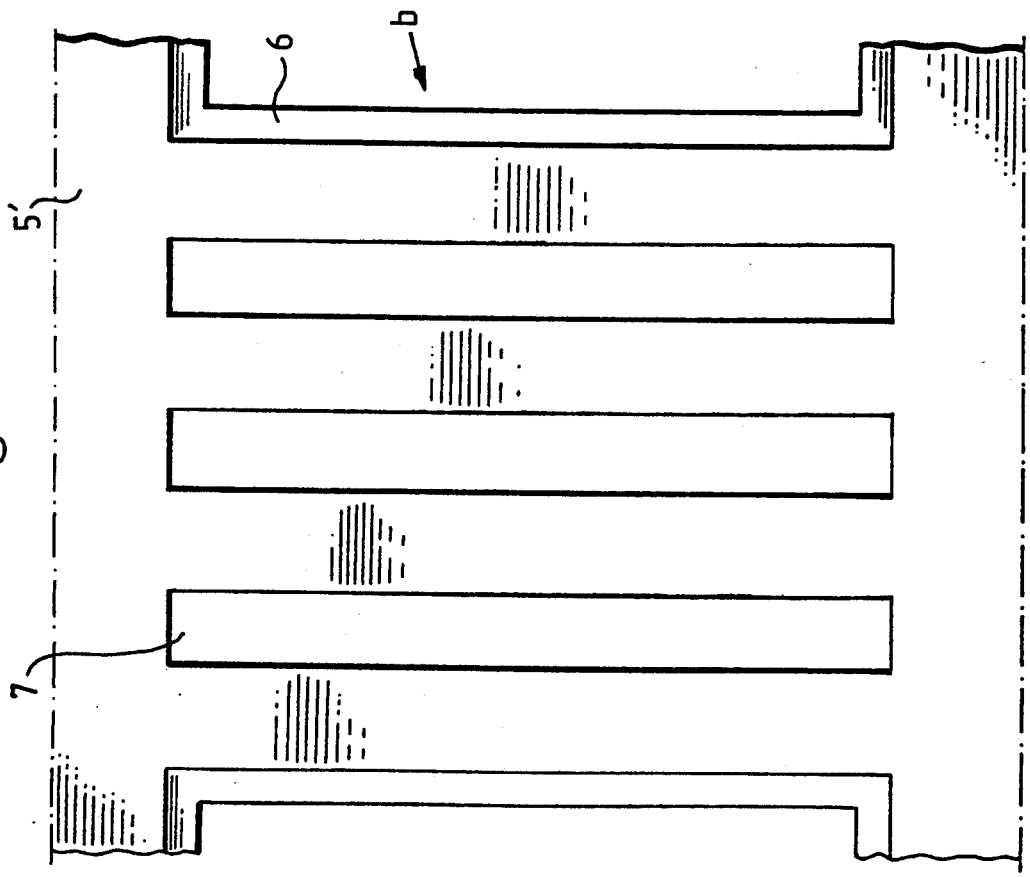

DEVICE WITH FLEXIBLE, STRIPLINE CONDUCTORS AND A METHOD OF MANUFACTURING SUCH A DEVICE

RELATED APPLICATION

This application covers an aspect of an invention which is also covered by a simultaneously filed application having the title "A circuit board having a lateral conductive pattern and shielded regions as well as a method of manufacturing such a board".

FIELD OF THE INVENTION

The present invention relates to a device with flexible strip line conductors enclosed by dielectric and ground planes, and a method of manufacturing such a device.

BACKGROUND OF THE INVENTION

In electronic equipment for high frequencies and data signals having short transient times there is a need of conducting such signals in conductors, for instance from one part of the equipment located at a distance from another part of the equipment, the conductors having a smooth, if possible equal impedance along the lengths thereof, and of providing for the closed individual shielding of the conductors. Over longer distances the signals usually are transmitted on coaxial wire having special shielded connectors. A disadvantage in regard of such wires is that they deviate from the ambition of arranging all conductors in the shape of flat, photo patterned conductors. Loose wires thus is a component, which by its unordered geometrical shape have a costly mounting, particularly when several wires are to be coupled to several different points in the electronic equipment. Further, making several wires into bundles is labour consuming compared to the manufacture of photo etched patterns.

PRIOR ART

From the European patents 0 288 767 and 0 337 331 and the U.S. Pat. No. 4 673 904 it is previously known to manufacture circuit patterns, wherein the conductors at all their sides are enclosed by a dielectric and ground plane.

The problem in respect of the methods according to these documents is that a multitude of selected metal patterns are applied to a substrate in several sequential procedural steps what makes even these methods complicated and the risk of obtaining a bad manufacture output is obvious. Another problem in this technique is related to the deposit of metals onto the substrate surface, since such metal layers have a bad ductility. Further this method is not compatible to what is generally established within the manufacture of conventional etched pattern boards.

SUMMARY OF THE INVENTION

The purpose of the present invention is to provide a simple method wherein the disadvantages discussed above in the prior art are eliminated.

This purpose is achieved with a device and a method of the kind mentioned in the beginning having the characteristics set out in the claims 1 and 5.

With the present invention thus a significantly simpler method is provided, wherein conductive patterns can be obtained by etching a metal foil adhesively bonded to a substrate than what has been used in the established technique. Then also rolled metal foil may be used which adds to providing some stretchability and flexibility to the device.

Thus the device has flexible stripline conductors enclosed by a dielectric and ground planes, these conductors having the shape of bands or strips with an essentially constant width and a small thickness compared to the width. The device contains a conductor laminate comprising
    a first dielectric or isolating substrate,
    said conductors being located on one of its surfaces and etched from a conductive layer, and
    a window which is cut between said conductors, and a ground plane laminate comprising
    a second dielectric or isolating substrate, which is cut essentially similarly to the substrate of the conductor laminate or with a slightly larger dimension and
    a conductive layer such as a copper foil applied to one first side of the second substrate.

The two laminates are attached to each other for instance by means of adhesive bonding, with the conductors of the conductor laminate applied to that side of the second substrate of the ground plane laminate, which is not coated with a conductive layer. Then a metallization is applied to the side of the device, which is opposite to the conductively coated surface of the ground plane laminate, which metallization is electrically connected to said conductively coated surface, such that the conductors and the substrates are completely enclosed by an electrically conducting layer.

According to an advantageous embodiment of the device according to the invention the foil of the ground plane laminate covers the window cut in the substrate and extends past the substrate edges. Thereby the foil will make a good contact with the metallization arranged, such that conductors and substrate are completely enclosed by an electrically conductive layer.

According to another advantageous embodiment of the device according to the invention the side of the conductor laminate which is opposite to the side provided with the conductors, is coated with a copper foil in order to improve the adhesion of the metallization applied to this surface.

In the method for the manufacture of the device a substrate having conductors etched on one of its sides is cut to a desired shape and windows are cut in the substrate between the conductors. A second substrate is cut to essentially the same shape as the substrate of the conductor laminate or to a slightly larger size and is coated with a continuous copper foil on one of its sides in order to form a ground plane laminate. The copper foil can project along all its edges, also inside the windows, past the edge of the underlying substrate. Then the two laminates are adhesively bonded to each other with the conductors of the conductor laminate being applied to the side which is not coated with the copper foil of the ground plane laminate. A metallization is applied to the side of the device which is opposite to the foil coated surface of the ground plane laminate and is thereby mechanically and electrically connected to said foil coated surface, in such a way that the conductors and substrates are enclosed by an electrically conducting layer.

SHORT DESCRIPTION OF THE FIGURES

An exemplary embodiment of the invention will now be described in more detail with reference to the accompanying drawings, in which FIG. 1 shows a conductor laminate in a plan view, FIGS. 2 and 3 show a top laminate, called a ground plane laminate as seen from its bottom side and its top side respectively, FIG. 4 shows a cross sectional view of the two assembled laminates, FIG. 5 shows a cross sectional view of the two assembled laminates having an alternative conductor laminate, FIG. 6 shows a cross sectional view of assembled laminated according to FIG. 5 having an alternative edge and bottom shielding, FIG. 7 illustrates how the conductors can be used for transferring signal between different parts of a circuit board, FIGS. 8 and 9 shows the conductor laminate and the top laminate respectively for four parallel conductors, FIG. 10 shows a cross sectional view of the two assembled laminates for the case illustrated in FIGS. 8 and 9.

DESCRIPTION OF THE PREFERRED EMBODIMENT

In the figures the thicknesses illustrated of the substrates and the foils are highly exaggerated in order to clarify the invention.

Figure 1:
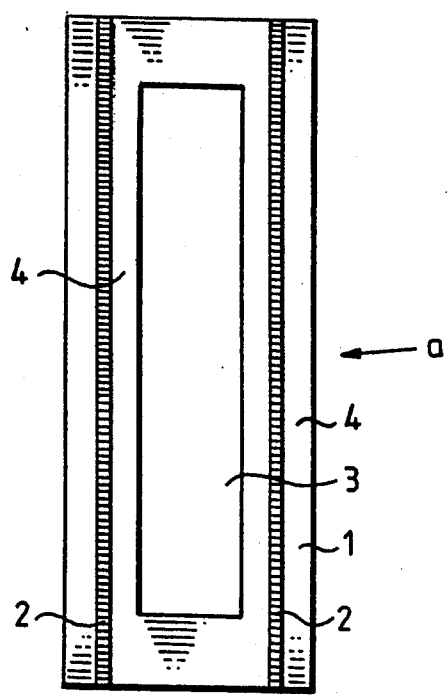

The conductive laminate a shown as seen from the top in FIG. 1 comprises a first isolating or dielectric substrate 1, which is coated with copper foil on one side. In the copper foil conductors 2 are etched, these conductors 2 having a bandlike or striplike shape with an equal width over their length and extending along and in parallel with an edge of the first substrate 1. In the example shown in FIG. 1 there are two conductors 2 extending also in parallel with each other. A window 3 or through-hole is cut in the substrate 1 in order to separate the regions 4 of the substrate 1 supporting the conductors 2, this window also having edges extending in parallel with the conductors 2 and at distance from the conductors 2 which thus is substantially equal over the considered lengths of the conductors 2 and also is substantially equal to the distance of the conductors 2 to their adjacent edge of the first substrate 1.

Figure 2:
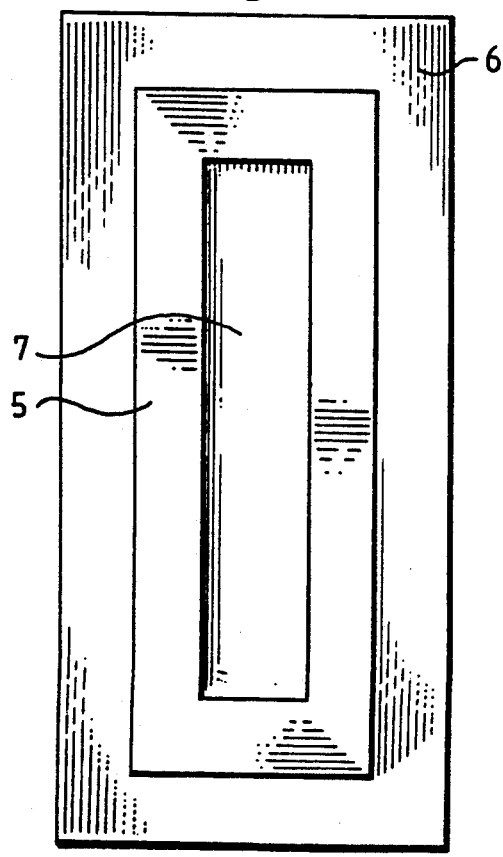
Figure 3:
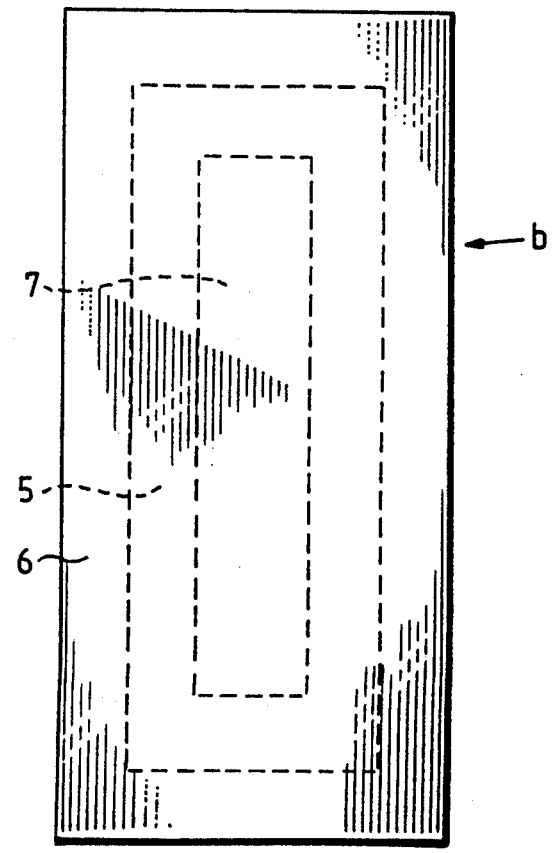

The second laminate b, the ground plane laminate, as illustrated in FIGS. 2 and 3, comprises a second isolating or dielectric substrate 5 cut to the same outer shape and size as the conductor laminate a or to a somewhat larger dimension than the conductor laminate. Also a window 7 is made in the second substrate 5 corresponding to the window 3 of the first substrate 1. This window is positioned in such a way that when the second laminate b is placed to correctly fit with the first laminate a, the edges of the window 7 in the second substrate, especially the edges extending in parallel with the conductors 2, will be accurately positioned above the corresponding edges of the window 3 in the first substrate 1 or project a little past the underlying edges of the first substrate 1. The width of the projections past the edges of the first substrate 1 is chosen to have at least the same order of magnitude as the thicknesses of the laminates.

The second substrate 5 is on a first side coated, all over this side, with a conductive layer or copper foil 6 also covering the window 7 cut in the substrate 5 and protruding past all the edges of the substrate 5, also from the edges of the window 7. The width of the protruding portions may here also have at least the same magnitude of order as the thicknesses of the laminates.

The substrates are suitably artificial resin sheets and the contour cutting of the two laminates a, b can be performed by means of a laser beam or a water jet.

Figure 4:
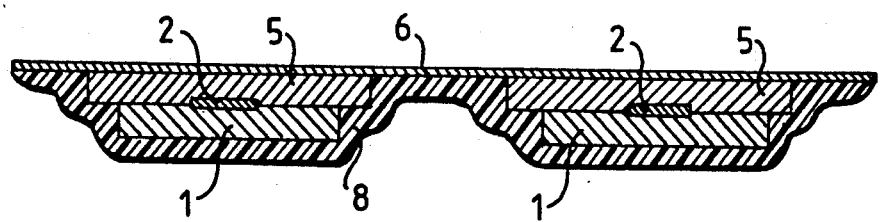

The two laminates, the conductor laminate a and the ground plane laminate b, are adhesively bonded to each other with the conductors 2 of the conductor laminate a applied to that second side of the substrate 5 of the ground plane laminate b, which is not coated with a conductive layer, such that the signal conductors 2 on all sides will be enclosed by dielectric material, see FIG. 4.

A metallization 8, for instance obtained by thermal spraying such as flame spraying of a low-melting metal such as tin or an alloy thereof, is applied to the side of the assembled device, see FIG. 4, which is opposite to the surface which is coated with the conductive foil 6 of the ground plane laminate b. This metallization 8 is electrically connected to the conductive foil 6, particularly at the protruding margin of the foil 6, such that the conductor 2 and substrates 1, 5 in this way will be completely enclosed by an electrically conducting layer.

Figure 5:
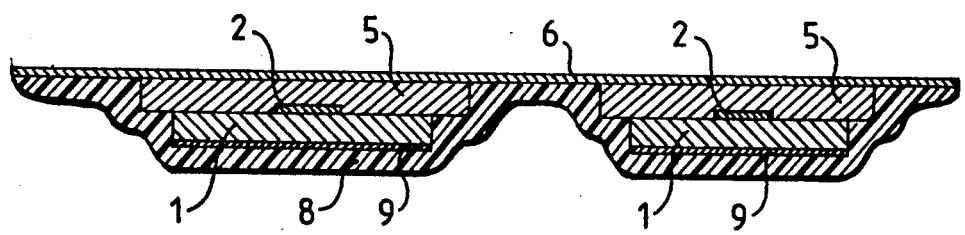

Possibly that second side of the first substrate 1 or the conductor laminate a which is opposite to the first side provided with the conductors 2 may be coated with a copper foil 9, on which said metallization 8 then is applied, see FIG. 5. This copper foil 9 may be laminated to the first substrate 1 before it is contour cut. The copper foil will improve the adhesion of the metallized layer 8 to the bottom side of the finished device and it will provide a higher ductility to the device.

Figure 6:
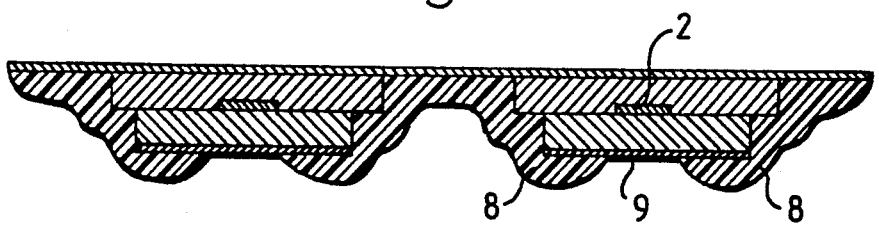

When such a metal foil 9 is arranged on the bottom of the device, the metallized layer 9 must not necessarily cover all of the bottom side of the device, see FIG. 6, but only the unshielded edges of the laminated device.

Figure 7:
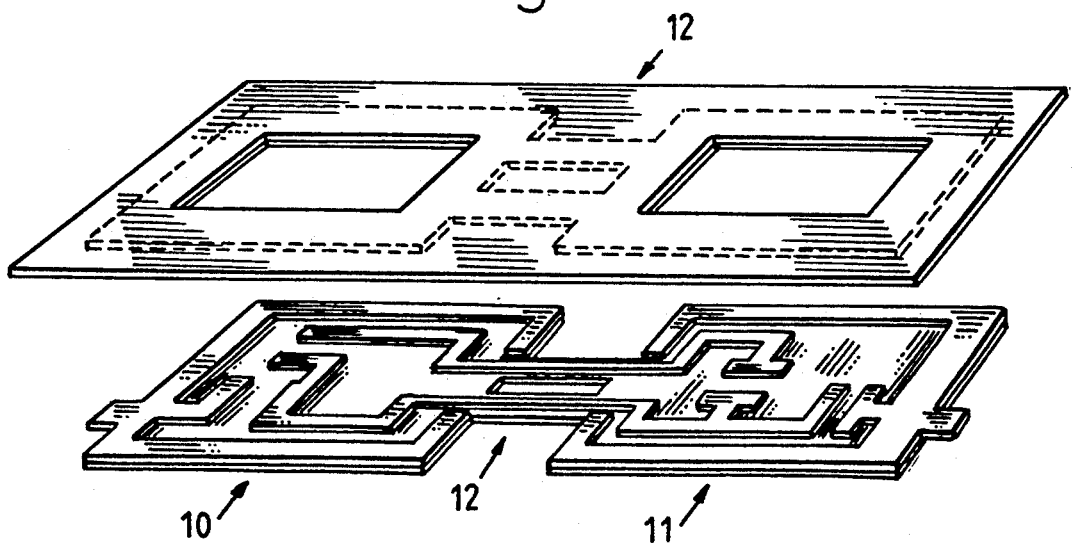

In FIG. 7 an unassembled circuit pattern board is illustrated which has, as the device described above, a bottom laminate and a top laminate, there being two areas 10, 11 comprising more or less complicated circuit patterns for the mounting of components. These areas 10 and 11 are connected by a narrow region 12 comprising the device as described above.

Figure 10:
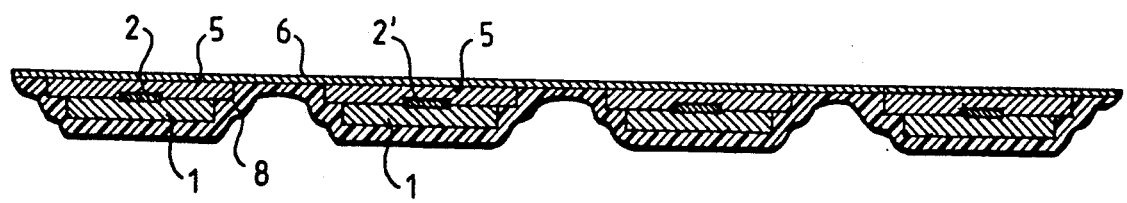

All conductors 2 may not be located at an edge of the first substrate 1 and this case is illustrated in FIGS. 8–10. Here there are conductors 2' of the same shape as the conductors 2 which on both sides are surrounded by windows 3 cut in the first laminate a. Along at least a portion of the lengths of the conductors 2' edges of the windows 3 extend in parallel with the conductors 2' in the similar way and at the same distance as is mentioned above for FIG. 1.

As is obvious to anyone skilled in the art, the invention can be modified in many different ways and the scope of the invention is only defined by the appended claims. Thus for instance the copper foil 6 on top of the ground plane laminate b may only have tabs or portions of its margin projecting past the substrate 5 of the ground plane laminate. This may also be true in respect of the edges of the windows 7 in the second substrate 5 or said copper foil 6 may there form a continuous marginal projecting portion extending all along one or more of the edges of the windows, in the direction towards the middle of the windows 7.

I claim:

1. A device with flexible stripline conductors enclosed by dielectric and ground planes, wherein
   a conductor laminate is arranged comprising
      a first dielectric isolating substrate,
         said flexible stripline conductors being located on one of said laminate's surfaces and etched from said conductor laminate's conductive layer, and
      a window opening, being cut between said conductor laminate's conductors, and
   a ground plane laminate is arranged comprising
      a second dielectric isolating substrate, being cut similarly to said conductor laminate's conductive layer only with a slightly larger dimension and
      a conductive layer such as a copper foil being applied to a first side of said second dielectric isolating substrate,
   wherein said conductive layers and all laminates are attached to each other for instance by means of adhesive bonding, with the stripline conductors of said conductor laminate being applied to said dielectric isolating substrate layer of said ground plane laminate, and
   wherein a metallization is applied to a side of said device, which is opposite to the conductive surface of said ground plane laminate and is electrically connected to said conductive surface in a manner which completely encloses said conductors and said substrates by an electrically conductive layer.

2. A device according to claim 1, wherein said conductive layer of said ground plane laminate covers said window openings cut in said substrate and extends past said edges of said substrate.

3. A device according to claim 1, wherein said side of said conductor laminate, which is opposite to said first side being provided with said flexible stripline conductors, is coated with a conductive layer of copper foil on which said metallization is applied.

4. A device according to claim 1, wherein said substrates are made of artificial resin sheets.

5. A device with bandshaped conductors enclosed by a dielectric two large surfaces of said bandshaped conductors surrounded by ground planes, wherein
   a conductor laminate is arranged comprising
      first dielectric substrate,
      said bandshaped conductors being located on a first surface of said first dielectric substrate,
      at each side of a considered length of each of said bandshaped conductors there is an edge extending substantially in parallel with said conductor of said first dielectric substrate and an edge of a window opening through the thickness of said first dielectric substrate,
   a ground plane laminate is arranged comprising
      a second substrate, having edges, being cut similarly to said first dielectric substrate including window openings coinciding with said window openings of said first dielectric substrate and
      a first conductive layer located on a first side of said second substrate,
   wherein said conductor laminate and ground plate laminate are attached to each other with said bandshaped conductors of the conductor laminate applied to said second side of said second substrate of said ground plane laminate, which is not coated with said first conductive layer, and
   wherein a second conductive layer is located on a side of the device, which is opposite to first side of the ground plane laminate having said first conductive layer, said second conductive layer extending over the edges of said first and second substrates, also inside said window openings to be electrically connected to edges of first conductive layer located on said second substrate, such that said bandshaped conductors and said substrates are completely enclosed by an electrically conductive layer.

6. A device according to claim 5, wherein said edges of said second substrate project past said edges of said first substrate by a width having at least the same magnitude of order as said thickness of said first dielectric and second substrates.

7. A device according to claim 5, wherein said conductive layer of said ground plane laminate projects past said edges of said second substrate and said edges of said window openings in said ground plane laminate, at least partly along its outer and inner edges.

8. A device according to claim 5, wherein said first conductive layer of said ground plane laminate covers said window openings in said ground plane laminate.

9. A device according to claim 5, wherein said second conductive layer comprises on a second side of said conductor laminate, which is opposite to said first side provided with said bandshaped conductors, a layer of copper foil, and a metal coating at least covering all of said edges of said conductor and ground plane laminates and also an edge portion of said of copper foil layer located on said second side of said first substrate.

10. A device according to claim 5, wherein said first dielectric substrate and said second substrate are made of artificial resin sheets.

11. A method for the manufacture of a device with bandshaped conductors enclosed by a dielectric and a large surface of said bandshaped conductors surrounded by ground plane, comprising the steps of:
   forming a conductor laminate comprising a first dielectric substrate, wherein bandshaped conductors on one of said conductor laminate sides is given a desired shape,
   forming window openings in said first substrate between said bandshaped conductors,
   forming a second dielectric substrate similar in shape as said first substrate,
   forming window openings in said second substrate, which essentially coincide in shape and location with said window openings in said first substrate,
   coating said second substrate with a first conductive layer on one of said second substrates' sides in order to form a ground plane laminate,
   attaching said conductor laminate and said ground plane laminate to each other by adhesive bonding, with said bandshaped conductors of said conductor laminate being applied to a side of the ground plane laminate which is not coated with said first conductive layer, and
   coating another side of the device, which is opposite to said conductive surface of said ground plane laminate, edges of said laminates, and edges inside said window openings to be electrically connected to said conductive layer on said ground plane laminate with a second conductive layer, so that said bandshaped conductors, said first dielectric substrate, and said second substrate are enclosed by an electrically conductive layer.

12. A method according to claim 11, wherein said desired shaped of said first dielectric substrate, said second substrate, and said window openings are made by means of a laser beam.

13. A method according to claim 11, wherein said desired shaped of said first dielectric substrate, said second substrate, and said window openings are made by means of a water jet.

14. A method according to claim 11, wherein said second conductive layer applied to said other side of said device is at least partly applied by thermal spraying of a low-melting metal.

* * * * *